United States Patent
Merandat

(10) Patent No.: US 9,478,294 B2
(45) Date of Patent: Oct. 25, 2016

(54) DUMMY MEMORY ERASE OR PROGRAM METHOD PROTECTED AGAINST DETECTION

(71) Applicant: INSIDE SECURE, Meyreuil (FR)

(72) Inventor: Marc Merandat, Meyreuil (FR)

(73) Assignee: INSIDE SECURE, Meyreuil (FR)

( * ) Notice: Subject to any disclaimer, the term of this patent is extended or adjusted under 35 U.S.C. 154(b) by 0 days.

(21) Appl. No.: 14/406,334

(22) PCT Filed: Jun. 28, 2013

(86) PCT No.: PCT/FR2013/051519
§ 371 (c)(1),
(2) Date: Dec. 8, 2014

(87) PCT Pub. No.: WO2014/009627
PCT Pub. Date: Jan. 16, 2014

(65) Prior Publication Data
US 2015/0124532 A1    May 7, 2015

(30) Foreign Application Priority Data

Jul. 9, 2012   (FR) ..................... 12 01940

(51) Int. Cl.
| | | |
|---|---|---|
| *G11C 11/34* | (2006.01) | |
| *G11C 16/14* | (2006.01) | |
| *G11C 16/22* | (2006.01) | |
| *G11C 16/34* | (2006.01) | |

(52) U.S. Cl.
CPC ............. *G11C 16/14* (2013.01); *G11C 16/22* (2013.01); *G11C 16/3436* (2013.01); *G11C 16/3445* (2013.01)

(58) Field of Classification Search
CPC ... G11C 16/14; G11C 16/22; G11C 16/3436; G11C 16/3445
USPC ............ 365/185.19, 185.03, 185.11, 185.14, 365/185.17, 185.18, 185.22, 185.24, 185.29
See application file for complete search history.

(56) References Cited

U.S. PATENT DOCUMENTS

| | | | |
|---|---|---|---|
| 2002/0101763 A1 | 8/2002 | Hosogane et al. | |
| 2002/0174310 A1 | 11/2002 | Ueyama | |
| 2008/0117674 A1 | 5/2008 | Lee | |
| 2012/0287710 A1* | 11/2012 | Shirakawa | ......... G11C 16/0483 365/185.03 |

OTHER PUBLICATIONS

International Search Report issued in International Application No. PCT/FR2013/051519 mailed Oct. 9, 2013.

* cited by examiner

*Primary Examiner* — Fernando Hidalgo
(74) *Attorney, Agent, or Firm* — Brake Hughes Bellermann LLP

(57) ABSTRACT

In a general aspect, a method of writing data in a nonvolatile memory can include performing a first erase or program cycle to write regular data in a first memory cell of the non-volatile memory by (i) applying at least one erase or program pulse to the first memory cell and (ii) determining the state, erased or programmed, of the first memory cell, and repeating (i) and (ii) if the first memory cell is not in the desired state. The method can also include applying a predetermined number of erase or program pulses to write fake data in a second memory cell.

12 Claims, 3 Drawing Sheets

DUMMY MEMORY ERASE OR PROGRAM METHOD PROTECTED AGAINST DETECTION

The present invention relates to a method of erasing or programming memory cells of a nonvolatile memory, and to such a nonvolatile memory.

Nonvolatile semiconductor memories, such as EEPROM and Flash, generally comprise an array of electrically erasable and programmable memory cells. Such memory cells generally comprise at least one floating gate transistor FGT. A floating gate transistor generally comprises source and drain regions, a channel region extending between the source and drain regions, a control gate extending over the channel region, and a floating gate extending between the control gate and the channel region.

A floating transistor is programmed by applying voltage pulses ("program pulses") to its source or drain region, or through its bulk region, to inject electrical charges into the floating gate. Conversely, it is erased by applying voltage pulses ("erase pulses") to its control gate or through the bulk region, to extract electrical charges from the floating gate. The amount of electrical charges in the floating gate defines the threshold voltage of the transistor, which corresponds to the value of a data stored in the memory cell.

Such memory cells have a limited effective life, also known as the endurance. The number of erasing and programming cycles that such a cell can endure before becoming degraded is finite, due to the repeated transfer of charges to and from the floating gate. As a result, the number of program or erase pulses to be applied to a memory cell to perform the program or erase process may increase over time, with the ageing of the cell.

Therefore, in some memories, the number of erase or program pulses applied to a memory cell is monitored by a control circuit, which verifies the state of the memory cell whilst it is being erased or programmed. The number of erase or program pulses is adjusted in real time until the cells have reached the desired erased or programmed state, or until a maximum authorized number of pulses is reached. In this manner, the dispersion of the threshold voltages of the different memory cells is reduced within the entire memory array.

Figure 1:
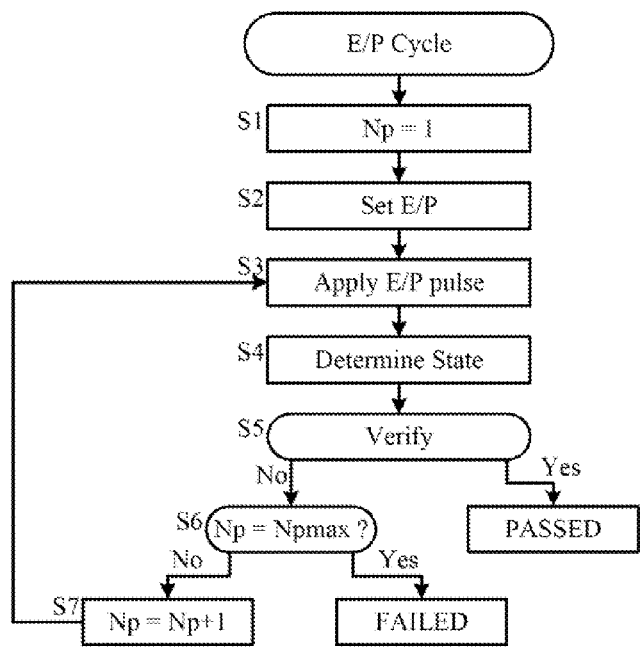

FIG. 1 is a flow chart of a conventional cycle of performing erase or program cycles on memory cells, for example of the type described in U.S. Pat. No. 7,983,078.

In a step S1, a variable Np is set to an initial value, for example 1. In a step S2, the erase or program operation is initialized. In a step S3, one erase or program pulse is applied to designated memory cells. In a step S4, the states of the memory cells are determined. In a step S5, the states of the memory cells are verified, to check whether they correspond to the desired state. If the response is yes, the control circuit terminates the cycle as "passed". If the desired state is not yet reached, during a step S6 it is verified whether Np is equal to an authorized maximum number of pulses Npmax. If the response is yes, the cycle is terminated as "failed". If Np is less than Npmax, Np is increased by one in a step S7, and the cycle returns to step S3.

In some applications such as cryptographic calculations, it is sometimes desired to mask some write operations when sensitive data are concerned. This masking may include writing fake data in some memory cells, to mislead a third party observing the behavior of the memory circuit. Writing fake data in memory cells is performed as shown in FIG. 1, with the only difference that the actual value of the data at the end of the erase or program cycle has no importance.

For the sake of simplicity, erase or program cycles relating to fake data will be called "dummy" operations in what follows, and memory cells designated to receive such fake data will be designated "dummy" cells.

In general, while dummy cycles generally occur less frequently than regular data cycles, a smaller portion of the available memory space is dedicated to dummy operations. As a result, the memory cells dedicated to dummy operations are subjected to more erase and/or program cycles than memory cells dedicated to regular operations. As a result, the dummy memory cells age more quickly than regular memory cells, and, over time, dummy erase or program operations may be distinguished from regular erase or program operations in that they involve more erase or program pulses.

The present invention includes the observation that, by counting the number of pulses involved in an erase or program operation, an attacker may be able to distinguish a dummy erase or program operation from a regular erase or program operation.

It may therefore be desired to provide a method of performing an erase or program cycle that reduces such a security risk.

Embodiments of the invention relate to a method of programming or erasing memory cells of a nonvolatile memory comprising a first erase or program cycle of first memory cells, comprising the steps of: i) applying at least one erase or program pulse to the memory cells, ii) determining the state, erased or programmed, of the memory cells, and iii) repeating steps i) and ii) if the memory cells are not in the desired state, wherein the method further comprises a second erase or program cycle of second memory cells, comprising applying a predetermined number of erase or program pulses to the second memory cells.

According to one embodiment, the predetermined number of erase or program pulses is a function of a first number of pulses applied to first memory cells during at least one first erase or program cycle of first memory cells.

According to one embodiment, the second cycle comprises: iv) applying at least one erase or program pulse to the memory cells, v) determining the state, erased or programmed, of the memory cells, and vi) repeating steps iv) and v) until the predetermined number of erase or program pulses is applied to the second memory cells.

According to one embodiment, the method comprises a step of verifying whether the erase or program cycle is performed on the first or the second memory cells.

According to one embodiment, the first erase or program cycle comprises a step of storing the number of pulses applied to the first memory cells to set them in the desired state.

According to one embodiment, the predetermined number of erase or program pulses is determined according to at least one of the following methods: the predetermined number of erase or program pulses is a function of the number of erase or program pulses applied to the first memory cells during one first erase or program cycle of first memory cells; the predetermined number of erase or program pulses is a function of an average value of numbers of erase or program pulses applied to the first memory cells during a plurality of first erase or program cycles of first memory cells; the predetermined number of erase or program pulses is a function of a maximum value of numbers of erase or program pulses applied to the first memory cells during a plurality of first erase or program cycles of first memory cells.

According to one embodiment, the method comprises writing regular data in the first memory cells by means of the first erase or program cycle, and writing fake data in the second memory cells by means of the second erase or program cycle.

Embodiments of the invention also relate to a nonvolatile memory comprising an array of memory cells, and a control circuit configured to perform a first erase or program cycle of first memory cells of the memory, the first erase or program cycle comprising the steps of: i) applying at least one erase or program pulse to the memory cells, ii) determining the state, erased or programmed, of the memory cells, and iii) repeating steps i) and ii) if the memory cells are not in the desired state. The control circuit is further configured to perform a second erase or program cycle of second memory cells comprising applying a predetermined number of erase or program pulses to the second memory cells.

According to one embodiment, the control circuit in configured to determine the predetermined number of erase or program pulses as a function of a first number of pulses applied to first memory cells during at least one first erase or program cycle of first memory cells.

According to one embodiment, the control circuit, when performing the second erase or program cycle, is configured to: iv) apply at least one erase or program pulse to the memory cells, v) determine the state, erased or programmed, of the memory cells, and vi) repeat steps iv) and v) until the predetermined number of erase or program pulses is applied to the second memory cells.

According to one embodiment, the control circuit is configured to store the number of pulses applied to the first memory cells to set them in the desired state, when the first erase or program cycle is performed.

According to one embodiment, the control circuit is configured to determine the predetermined number of erase or program pulses is determined according to at least one of the following methods: the predetermined number of erase or program pulses is a function of the number of erase or program pulses applied to the first memory cells during one first erase or program cycle of first memory cells; the predetermined number of erase or program pulses is a function of an average value of numbers of erase or program pulses applied to the first memory cells during a plurality of first erase or program cycles of first memory cells; the predetermined number of erase or program pulses is a function of a maximum value of numbers of erase or program pulses applied to the first memory cells during a plurality of first erase or program cycles of first memory cells.

According to one embodiment, the control circuit is configured to write regular data in the first memory cells by means of the first erase or program cycle, and write fake data in the second memory cells by means of the second erase or program cycle.

According to one embodiment, the control circuit is configured to memorize addresses of second memory cells, and only apply the second erase or program cycle to second memory cells.

Embodiments of the invention also relate to an electronic device comprising a nonvolatile memory according to the invention.

Figure 2:
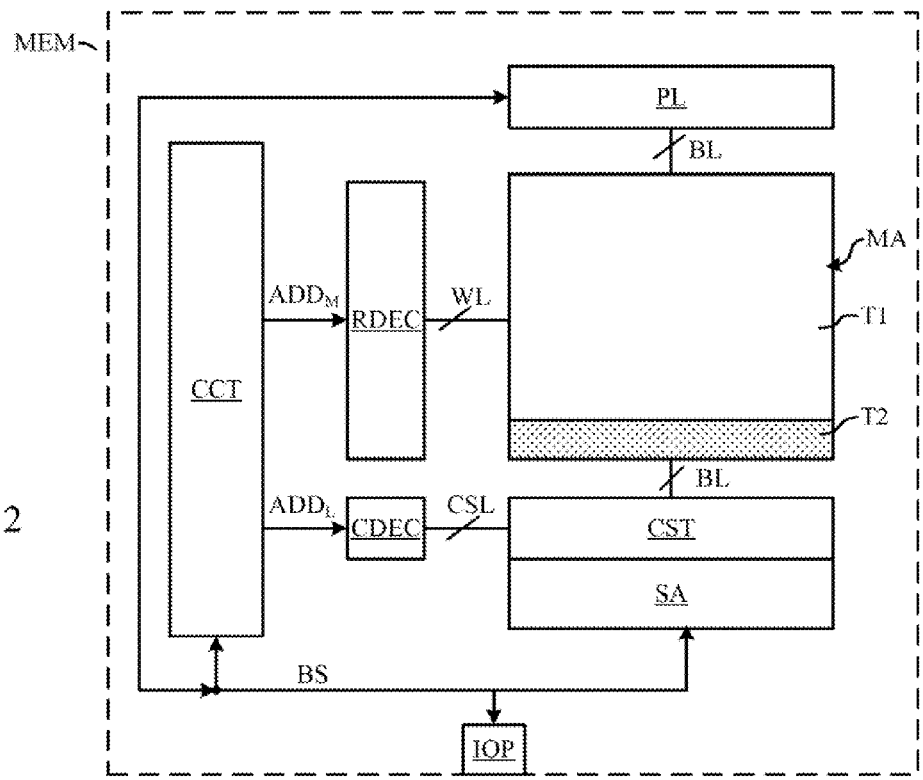
Figures 3A, 3B:
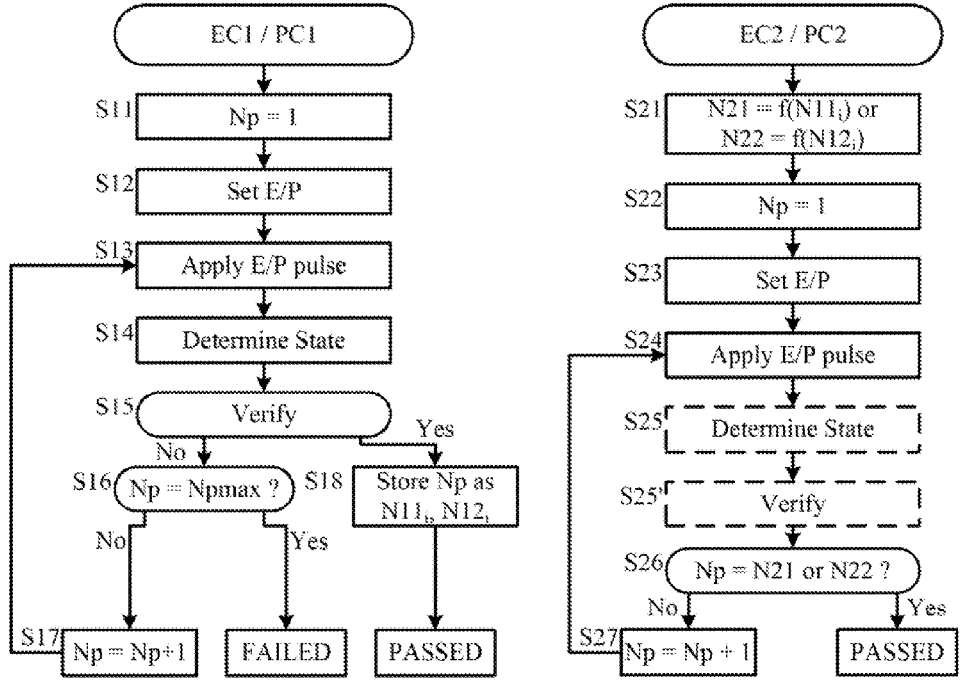
Figure 4:
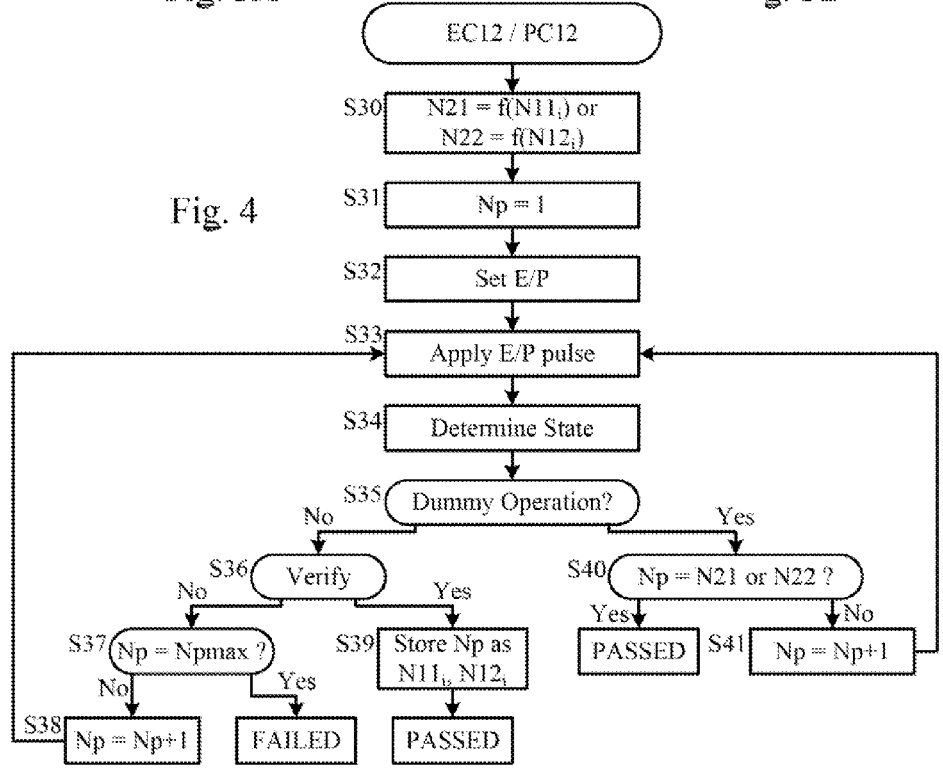
Figure 5:
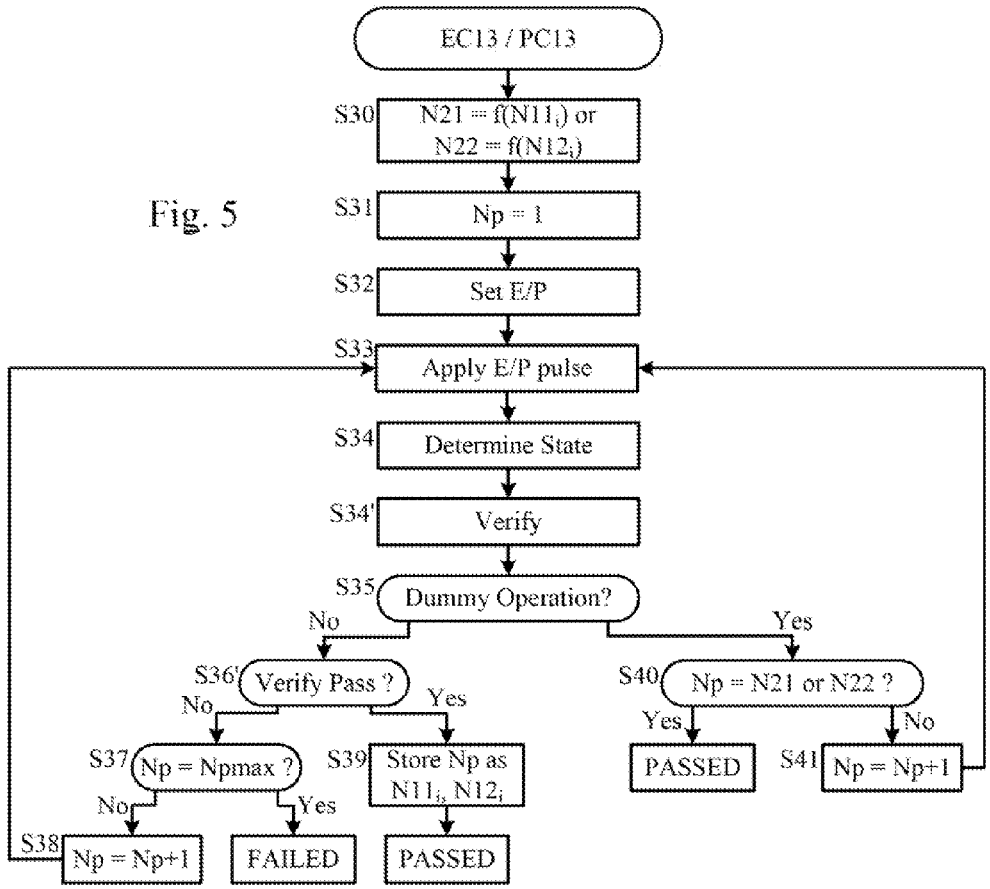
Figure 6:
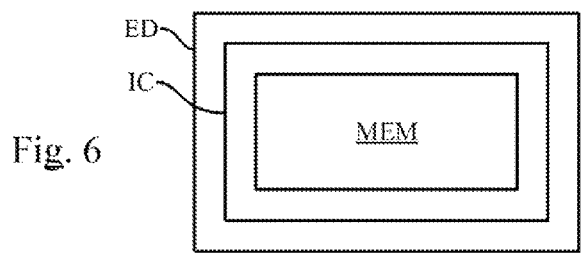

Embodiments of the present invention will now be described in connection with, but not limited to, the appended drawings in which:

FIG. 1, previously described, is a flow chart showing a conventional method of performing a memory cell erase or program cycle, FIG. 2 is a block diagram of an embodiment of a memory device according to the invention, FIGS. 3A and 3B are flow charts showing erase or program cycles according to one embodiment of the invention, FIG. 4 is a flow chart showing an erase or program cycle according to another embodiment of the invention, FIG. 5 is a flow chart showing an erase or program cycle according to yet another embodiment of the invention, and FIG. 6 shows an electronic device comprising a memory device according to the invention.

FIG. 2 schematically shows a nonvolatile memory MEM according to one embodiment of the invention. The memory MEM comprises an array MA of memory cells, a row decoder RDEC, a column decoder CDEC, a block of programming latches PL, a group of column select transistors CST, a block of sense amplifiers SA, an input/output port IOP, and a control circuit CCT.

The memory array comprises memory cells (not shown) connected to word lines WL and bit lines BL. The row decoder RDEC is connected to the word lines, the program latches PL are connected to one end of the bitlines, and the sense amplifiers SA are coupled to another end of the bitlines through the select transistors CST. The latter are controlled by the column decoder CDEC through column select lines CSL.

The control circuit CCT is coupled to an input/output of the IOP port, to inputs of the program latches PL and outputs of the sense amplifiers SA via a bus BS. The control circuit receives, through port IOP, erase, program or read commands sent by a host controller (not shown). Such commands include addresses of memory cells and data to be written. In one embodiment, the control circuit CCT is configured to receive write commands instead of erase and program commands, and executes them by performing corresponding erase and program cycles.

Data to be written in the memory array are loaded in the program latches PL, while data read in the memory array are supplied by the sense amplifier SA. Erase, program, or read addresses ADD are loaded in the row decoder RDEC and the column decoder CDEC, the first receiving the Most Significant Bits $ADD_M$ thereof and the second the Least Significant Bits $ADD_L$ thereof.

The control circuit may include a microprocessor with a program memory (not shown) or a state machine, different registers, different supply circuits to provide voltages required for erase, program, read operations, as well as voltages for the determination of the states of memory cells through the sense amplifiers.

The memory array may comprise two types T1, T2 of memory cells. Memory cells of type T1 are used to store regular data (application data) while memory cells of type T2 are used as "dummy" memory cells, to store fake data.

The location of the dummy memory cells may be predefined when the memory is designed or when it is personalized. It may also be defined dynamically by the host controller coupled to the memory, by sending to the memory a specific configuration command indicating locations of dummy memory cells, or dummy write commands designating such locations.

The dummy memory cells are preferably located in a same page (an ensemble of memory cells connected to a same word line WL) or in the same sector (an ensemble of adjacent pages), or else in different pages or sectors containing only dummy memory cells. In one embodiment, the status of memory cells, once defined as T2, is irreversible throughout the lifetime of the memory.

The control circuit CCT is configured to perform two types of erase cycles EC1, EC2 and two types of program cycles PC1, PC2. Cycles EC1, PC1 are respectively regular erase and program cycles applied to memory cells of type T1. Cycles EC2, PC2 are respectively dummy erase and program cycles applied to memory cells of type T2.

Cycles EC1, PC1 have the same structure and are shown by the same flow chart in FIG. 3A. Each comprises steps S11 to S17. In step S11, the previously mentioned variable Np is set to an initial value, here 1. In step S12, the erase or program operation is initialized. Such initialization comprises for example providing the appropriate voltages for the erase or program cycle (including activation of a charge pump for example), applying addresses $ADD_M$, $ADD_L$ to the row and column decoders, and, for the program cycle PC1, storing the data in the programming latches PL. In step S13, the control circuit applies one erase or program pulse to designated memory cells. In step S14, the control circuit determines the states of the memory cells. This operation is performed for example by sensing the threshold voltages of the memory cells under a specific read voltage, by means of the sense amplifiers SA. Each sense amplifier outputs a bit that gives an indication of the state of a memory cell to which it is coupled.

In step S15, the control circuit verifies whether the states of the memory cells correspond to the desired state, erased or programmed. If no, in step S16 the control circuit verifies whether Np is equal to a maximum number of pulses Npmax that can be applied. If the response is yes, the cycle is terminated as "failed". If Np is less than Npmax, the control circuit increases Np by one at step S17, and returns to step S13 to apply a further erase or program pulse to the memory cells.

If at step S15 the states of the memory cells correspond to the desired states, the erase or program cycle is terminated as "passed". Before terminating the cycle, in step S18 the control circuit stores the variable Np in a register, respectively as an erase reference value $N11_i$ or a program reference value $N12_i$, "i" representing the rank of the current cycle EC1 or PC1 amongst a plurality of cycles of the same nature, erase or program, where similar variables have been recorded.

The erase or program cycles EC2, PC2 have the same structure and are shown by the same flow chart in FIG. 3B. Each comprises steps S21 to S27.

In step S21, if the erase cycle EC2 is performed, a dummy erase parameter N21 is set as a function of the reference values $N11_i$ of previous regular erase cycles EC1. If the program cycle PC2 is performed, a dummy program parameter N22 is set as a function of the reference values $N12_i$ of previous regular program cycles PC1.

In step S22, the variable Np is set to 1. In step S23, the erase or program operation is initialized. In step S24, the control circuit applies one erase or program pulse to designated memory cells. In step 25, which is optional, the control circuit determines the states of the memory cells. In step S26, the control circuit verifies whether Np is equal to N21 if the erase cycle EC2 is being performed or equal to N22 if the program cycle PC2 is being performed. If the response is yes, the control circuit terminates the cycle as "passed". If the response is no, Np is increased by one in step S27, and the control circuit returns to step S24 to apply a further pulse to the concerned memory cells.

It will be understood by the skilled person that the initialization step S22 is preferably identical to step S12 performed in cycle EC1 or PC1, and that step S25, though optional since not necessary for the dummy erase or program cycle, is provided in order that cycle EC2 resembles cycle EC1 and that cycle PC2 resembles cycle PC1 as much as possible in terms of current consumption, voltages generated, number of steps performed, etc.

In an embodiment, a verify step S25' may be included in cycles EC2, PC2, as shown in FIG. 3B, such that the cycle resembles cycles EC1, PC1 even more, but the result of the verification is not taken into consideration, such that step S26 is performed whatever the result.

In an embodiment, step S21 is performed by the control circuit before the execution of cycles EC2, PC2, as a background calculation, for example each time a new reference value $N11_i$ or $N12_i$ has been recorded after a cycle EC1 or PC1, in anticipation of future dummy cycles EC2, PC2.

Cycles EC1, EC2, PC1, PC2 are susceptible of various other embodiments. For example, Np may be set to an initial value "n" at step S11 or S22 and increased by "n" at steps S16 or S27. In that case, steps S13 or S24 include the application of "n" erase or program pulses to the memory cells. Also, step S26 may consist in verifying whether Np is greater than or equal to N21 or N22 instead of verifying strict equalities, in particular if the number "n" of erase or program pulses applied to the memory cells at step S24 is progressively increased with the ageing of the cells.

FIG. 4 is a flow chart showing an embodiment of an erase cycle EC12 or a program cycle PC12 according to the invention, both having the same structure and being shown by the same flow chart. Cycle EC12 is the result of the merging of cycle EC1 with cycle EC2 and can be a regular erase cycle or a dummy erase cycle. Likewise, cycle P12 is the result of the merging of cycle PC1 with cycle PC2 and can be a regular program cycle or a dummy program cycle.

Cycles EC12, PC12 comprise steps S30 to S41. Step S30 is equivalent to step S21 and consists in determining the parameter N21 or N22 as a function of reference values $N11_i$ or $N12_i$ of previous regular cycles EC12, PC12. As indicated above, this calculation may be done at another instant before the cycle is started, for example at the end of a precedent cycle EC12, PC12 relating to a regular erase or program operation, after step S39 described below.

Step S31 is equivalent to step S11 or S22 and consists in setting Np to 1. S32 is equivalent to step S12 or S23 and consists in initializing the erase or program operation. Step S33 is equivalent to step S13 or S24 and consists in applying one erase or program pulse to the concerned memory cells. Step S34 is equivalent to step S14 or S25 and consists in determining the states of the memory cells.

In step S35, the control circuit determines whether the current erase or program cycle EC12, PC12 is a regular erase or program cycle or a dummy erase or program cycle. This determination consists for example by determining whether the current cycle is carried out on memory cells of the second type T2 or of the first type T1, by examining the address received in the erase or program command and comparing it with a range of addresses corresponding to dummy pages or sectors. In another embodiment, the information that the current cycle is a "regular" or "dummy" cycle is included in the command itself. To save time when step S35 is performed, this determination may be carried out at the very beginning of cycle EC12, PC12, before step S30 is performed, and a flag may be set at a logic value indicating whether the current cycle is regular or dummy. In that case, step S35 only consists in testing the value of that flag.

If the current cycle is a regular cycle, the control circuit goes to a first execution branch comprising steps S36, S37, S38, S39 which are equivalent to steps S15, S16, S17, S18. If the current cycle is a dummy cycle, the control circuit goes to a second execution branch comprising steps S40, S41 which are equivalent to steps S26, S27.

First branch: in step S36, the control circuit verifies whether the states of the memory cells correspond to the desired states. If the states do not correspond, in step S37 the control circuit verifies whether Np applied is equal to Npmax. If the response is yes, the cycle is terminated as "failed". If the response is no, Np is increased by one in step S38, and the control circuit returns to step S33. If the response to step S36 is yes, Np is loaded into a register as the pulse reference value N11i or N12i in step S39, and the control circuit terminates the cycle as "passed".

Second branch: in step S40, the control circuit verifies whether Np is equal to N21 (if dummy erase cycle) or N22 (if dummy program cycle). If the response is yes, the control circuit terminates the cycle as "passed". If the response is no, Np is increased by one in step 41, and the control circuit returns to step S33.

In an alternative embodiment of the second branch, a verify step is performed before step S40, such that the first and second branches more closely resemble each other, in terms of current consumption, voltages generated, number of steps performed, etc. However, in this case, the result of the verify step is not taken into consideration.

FIG. 5 is a flow chart showing another embodiment of an erase cycle EC13 or a program cycle PC13 according to the invention. Cycles EC13, PC13 differ from cycle EC12, PC12 in that the verify step, designated here as step S34', has been placed after step S34 and before step S35. The result of the verify is then stored, for example as a "pass flag". In the first branch, the previous verify step S36 is replaced by a "Verify Pass?" step S36' wherein the control circuit merely verifies whether the verification at step S34' passed, such as by checking the "pass flag". In this manner, the erase and program cycles EC13, PC13 in the case of a dummy operation or a data operation more closely resemble each other, in terms of current consumption, voltages generated, number of steps performed, etc.

Different algorithms may be provided for the determination of the dummy erase parameter N21 as a function of different reference values $N11_i$ returned by regular erase cycles, and for the determination of the dummy program reference value N22 as a function of different reference values $N12_i$ returned by regular program cycles. These algorithms are preferably conceived so that a dummy erase or program cycles resembles a regular erase or program cycle as far as the number of pulses applied to the memory cells and the determination and verification of the states of the memory cells are concerned. These algorithms may differ greatly according to the application in which the invention is implemented, how the different pages or sectors of the memory array are used, and how and when the dummy memory cells are used.

Some non-limiting examples are given in what follows:
1) N21 is equal to or a function of the last reference value $N11_i$ recorded during the last regular erase cycle, and N22 is equal to or a function of the last reference value $N12_i$ recorded during the last regular program cycle, or
2) N21 is an average value of "I" last reference values $N11_i$ recorded during "I" last regular erase cycles, or a function thereof, and N22 is the average value of "I" last reference values $N12_i$ recorded during "I" last regular program cycles, or a function thereof, or
3) N21 is the maximum value of "I" last reference values $N11_i$ recorded during "I" last regular erase cycles, or a function thereof, and N22 is the maximum value of "I" last reference values $N12_i$ recorded during "I" last regular program cycles, or a function thereof.

These algorithms may be varied by adding to or subtracting from the above-mentioned values random values provided by a random number generator, or specific bias values. In other embodiments, the ages of the memory cells may also be taken into account, for example by considering only the reference values $N11_i$, $N12_i$ returned by regular erase or program cycles on memory cells within a specific range of ages. The location of memory cells within the memory array with respect to that of the dummy memory cells may also be taken into account. For example, the algorithm may only consider the reference values $N11_i$, $N12_i$ returned by regular erase or program cycles performed on memory cells within a specific area, for example an area where sensitive data are written during a cryptographic calculation.

In some embodiments, the memory may also comprise data sectors with different endurances. The following table shows example methods for determining N21 as a function of N11(A) and N11(B) when the memory comprises a first data sector "A" with a first endurance lifetime, for example 10,000 cycles, and a second data sector "B" with a second endurance lifetime, for example 1,000,000 cycles. Reference "bv" designates a bias value, for example −1, 0 or 1. N11(A) and N11(B) are themselves a function of erase reference values $N11_i$ recorded for the considered sectors A and B, and may be for example the last reference value $N11_i$, the average value of "I" last reference values $N11_i$, or the maximum value of "I" last reference values $N11_i$, according to the above-described methods. Finally, such examples are indeed applicable to the determination of N22 as a function of N12.

|  | Initial (fresh cells) N11(A) = 1 N11(B) = 1 | Half-life (aged cells) N11(A) = 2 N11(B) = 6 |
| --- | --- | --- |
| 1) N21 = N11(A) | N21 = 1 | N21 = 2 |
| 2) N21 = max(N11(A), N11(B)) | N21 = 1 | N21 = 6 |
| 3) N21 = average(N11(A), N11(B)) | N21 = 1 | N2 = 4 |
| 4) N21 = N11(B) + bv | N21 = 1 + bv | N2 = 6 + bv |

Despite that the invention was initially provided for security purposes to perform dummy erase or program cycles that resemble regular erase or program cycles, in some embodiments erase and program cycles EC2, PC2 according to the invention may be used for other purposes than performing dummy operations. For example, when a great number of erase or program cycles must be performed on a large sector of the memory array comprising memory cells of the same age, the regular erase/verify or program/verify cycles EC1, PC1 may be performed on first memory cells of the considered area, and then, if the reference parameters N11, N12 are stable, the erase or program cycles EC2, PC2 are performed on further memory cells without verification of the state of the memory cells, to reduce the global time for erasing or programming the large sector. In that case, the determination step S25 of cycles EC2, PC2 is not performed, to save time.

Also, it will be understood by the skilled person that the invention is susceptible to various other implementations and applications. In particular, the invention may be applied to FLASH memories having NOR or NAND type architectures, EEPROM memories, as well as any other type of erasable and programmable memory using the erase/verify and program/verify process. Thus, the invention is not limited to memory cells comprising floating gate transistors, but rather any type of memory cell to which multiple pulses may be applied to ensure erasure and/or programming.

It will further be understood that not all memory cells designated by an address must be correctly erased and/or programmed in order for the method to be considered as passed, but rather that a certain threshold may be set, above or below which the operation is considered to have passed or to have failed.

FIG. 6 shows an electronic device ED comprising an integrated circuit IC within which a nonvolatile memory MEM according to the invention is embedded. The electronic device ED may be a contactless chip card, a tag, a mobile phone, a Personal Digital Assistant, etc.

The invention claimed is:

1. A method for writing data in a nonvolatile memory, the method comprising:
    writing regular data associated with at least one calculation of a cryptographic operation in a first memory cell using a first data writing process, the writing regular data using the first data writing process including:
        applying at least one erase pulse or at least one programming pulse to the first memory cell;
        verifying a state of the first memory cell;
        updating a count of a number of erase pulses or programming pulses applied to the first memory cell; and
        if the first memory cell is not in a desired state, repeatedly applying at least one erase pulse or at least one programming pulse, verifying the state of the first memory cell and updating the count of the number of erase pulses or programming pulses applied to the first memory cell; and
    writing fake data not associated with a calculation of the cryptographic operation in a second memory cell using a second data writing process, the writing fake data using the second data writing process including applying a number of erase pulses or programming pulses to the second memory cell, the number of erase pulses or programming pulses applied to the second memory cell being based on the count of the number of erase pulses or programming pulses applied to the first memory cell, regardless of a programmed state or an erased state of the second memory cell.

2. The method of claim 1, wherein the second data writing process includes, after applying one erase pulse or programming pulse of the number of erase pulses or programming pulses to the second memory cell, performing a verification of the programmed or erased state of the second memory cell, so as to resemble the first data writing process in terms of a number of operations performed.

3. The method of claim 2, wherein the first data writing process and the second data writing process both further include verifying whether the first data writing process or the second data writing process is being performed to determine whether to repeatedly apply at least one erase pulse or at least one programming pulse, verify the state of a respective memory cell and update the count of the number of erase pulses or programming pulses applied.

4. The method of claim 1, wherein the first data writing process further includes storing the number of erase pulses or programming pulses applied to the first memory cell to set the first memory cell in the desired state.

5. The method according to claim 1, wherein:
    the first data writing process is performed on a plurality of memory cells; and
    determining the number of erase pulses or programming pulses applied to the second memory cell includes at least one of:
        determining the number of erase pulses or programming pulses applied to the second memory cell as a function of the number of erase pulses or programming pulses applied to the first memory cell using the first data writing process;
        determining the number of erase pulses or programming pulses applied to the second memory cell as a function of an average number of the number of erase pulses or programming pulses applied to the plurality of memory cells using the first data writing process; and
        determining the number of erase pulses or programming pulses applied to the second memory cell as a function of a maximum value of the number of erase pulses or programming pulses applied to the plurality of memory cells using the first data writing process.

6. A nonvolatile memory comprising:
    an array of memory cells, and
    a control circuit configured to:
        write regular data associated with at least one calculation of a cryptographic operation in a first memory cell using a first data writing process, the writing regular data using the first data writing process including:
            applying at least one erase pulse or at least one programming pulse to the first memory cell;
            verifying a state of the first memory cell;
            updating a count of a number of erase pulses or programming pulses applied to the first memory cell; and
            if the first memory cell is not in a desired state, repeatedly applying at least one erase pulse or at least one programming pulse, verifying the state of the first memory cell and updating the count of the number of erase pulses or programming pulses applied to the first memory cell; and
        write fake data not associated with a calculation of the cryptographic operation in a second memory cell using a second data writing process, the writing fake data using the second data writing process including applying a number of erase pulses or programming pulses to the second memory cell, the number of erase pulses or programming pulses applied to the second memory cell being based on the count of the number of erase pulses or programming pulses applied to the first memory cell, regardless of a programmed or erased state of the second memory cell.

7. The nonvolatile memory of claim 6, wherein the control circuit, when performing the second data writing process, is further configured to, after applying one erase or program pulse of the number of erase pulses or programming pulses to the second memory cell, perform a verification of the programmed state or the erased state of the second memory cell, so as to resemble the first data writing process in terms of a number of operations performed.

8. The nonvolatile memory of claim 6, wherein the control circuit, when performing both the first data writing process and the second data writing process, is further configured to verify whether the first data writing process or the second data writing process is being performed to determine whether to repeatedly apply at least one erase pulse or at least one programming pulse, verify the state of a respective memory cell and update the count of the number of erase pulses or programming pulses applied.

9. Nonvolatile memory according to claim 6, wherein the control circuit is further configured to store the number of erase pulses or programming pulses applied to the first memory cell to set the first memory cell in the desired state.

10. Nonvolatile memory according to claim 6, wherein the control circuit is further configured to:
- perform the first data writing process on a plurality of memory cells; and
- determine the number of erase pulses or programming pulses applied to the second memory cell by at least one of:
  - determining the number of erase pulses or programming pulses applied to the second memory cell as a function of the number of erase pulses or programming pulses applied to the first memory cell using the first data writing process;
  - determining the number of erase pulses or programming pulses applied to the second memory cell as a function of an average number of the number of erase pulses or programming pulses applied to the plurality of memory cells using the first data writing process; and
  - determining the number of erase pulses or programming pulses applied to the second memory cell as a function of a maximum value of the number of erase pulses or programming pulses applied to the plurality of memory cells using the first data writing process.

11. The nonvolatile memory of claim 6, wherein the control circuit is configured to:
- memorize an address of the second memory cell, and
- based on the memorized address, only apply the second data writing process to the second memory cell.

12. The nonvolatile memory of claim 6, wherein the nonvolatile memory is included in a mobile electronic device.

* * * * *

UNITED STATES PATENT AND TRADEMARK OFFICE
CERTIFICATE OF CORRECTION

| | |
|---|---|
| PATENT NO. | : 9,478,294 B2 |
| APPLICATION NO. | : 14/406334 |
| DATED | : October 25, 2016 |
| INVENTOR(S) | : Merandat |

Page 1 of 1

It is certified that error appears in the above-identified patent and that said Letters Patent is hereby corrected as shown below:

On the Title Page

Column 2, Item (57), under "ABSTRACT", Line 4, delete "non-volatile" and insert -- nonvolatile --, therefor.

In the Claims

In Column 10, Line 3, Claim 5, delete "The method according to claim" and insert -- The method of claim --, therefor.

In Column 11, Line 8, Claim 9, delete "Nonvolatile memory according to claim" and insert -- The nonvolatile memory of claim --, therefor.

In Column 11, Line 12, Claim 10, delete "Nonvolatile memory according to claim" and insert -- The nonvolatile memory of claim --, therefor.

Signed and Sealed this
Eighteenth Day of April, 2017

Michelle K. Lee
*Director of the United States Patent and Trademark Office*